(12) United States Patent
Park et al.

(10) Patent No.: US 9,520,239 B2
(45) Date of Patent: Dec. 13, 2016

(54) CHIP ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Sang Soo Park, Suwon-Si (KR); Soon Ju Lee, Suwon-Si (KR); Young Ghyu Ahn, Suwon-Si (KR); Heung Kil Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/671,714

(22) Filed: Mar. 27, 2015

(65) Prior Publication Data

US 2016/0111215 A1    Apr. 21, 2016

(30) Foreign Application Priority Data

Oct. 15, 2014    (KR) .................. 10-2014-0139021

(51) Int. Cl.
| | |
|---|---|
| *H05K 1/16* | (2006.01) |
| *H01G 4/30* | (2006.01) |
| *H01C 1/14* | (2006.01) |
| *H01C 1/148* | (2006.01) |
| *H01C 7/18* | (2006.01) |
| *H01G 2/06* | (2006.01) |

(Continued)

(52) U.S. Cl.
CPC .................. *H01G 4/30* (2013.01); *H01C 1/14* (2013.01); *H01C 1/148* (2013.01); *H01C 7/18* (2013.01); *H01G 2/065* (2013.01); *H01G 4/232* (2013.01); *H05K 3/3442* (2013.01); *H01C 7/008* (2013.01); *H01C 7/10* (2013.01); *H01G 4/12* (2013.01); *H05K 1/141* (2013.01); *H05K 2201/049* (2013.01); *H05K 2201/10015* (2013.01); *H05K 2201/10378* (2013.01); *H05K 2201/2045* (2013.01)

(58) Field of Classification Search
CPC .............. H05K 1/14; H05K 1/18; H01G 2/06; H01G 4/01; H01G 4/06; H01G 4/30; H01G 4/228
USPC .... 174/260, 126.2; 361/15, 301.4, 302, 303, 361/523
See application file for complete search history.

(56) References Cited

U.S. PATENT DOCUMENTS 6,456,481 B1 *  9/2002  Stevenson ............ A61N 1/3754
                                                    361/302
8,743,530 B2 *  6/2014  Kuroda ................. H01G 4/012
                                                    361/306.3

(Continued)

FOREIGN PATENT DOCUMENTS

| JP | 2004-134430 A | 4/2004 |
| JP | 5012658 B2 | 8/2012 |
| KR | 10-2011-0043780 A | 4/2011 |

*Primary Examiner* — Xiaoliang Chen
(74) *Attorney, Agent, or Firm* — McDermott Will & Emery LLP

(57) ABSTRACT

There is provided a chip electronic component may include: a ceramic body; external electrodes formed on both side portions of the ceramic body; and an interposer supporting the ceramic body and electrically connected to the external electrodes, wherein the interposer includes first and second terminal electrodes formed on both side portions thereof and recesses formed inwardly in the first and second terminal electrodes.

6 Claims, 7 Drawing Sheets

(51) Int. Cl.
*H01G 4/232* (2006.01)
*H05K 3/34* (2006.01)
*H01G 4/12* (2006.01)
*H01C 7/00* (2006.01)
*H01C 7/10* (2006.01)
*H05K 1/14* (2006.01)

(56) References Cited

U.S. PATENT DOCUMENTS

| | | | |
|---|---|---|---|
| 2004/0066589 A1* | 4/2004 | Togashi | H01G 2/065 361/15 |
| 2005/0105250 A1* | 5/2005 | Kobayashi | H01G 9/012 361/523 |
| 2008/0068102 A1* | 3/2008 | Moriya | H03B 5/36 331/68 |
| 2008/0289853 A1* | 11/2008 | Sakai | H01L 23/49822 174/126.2 |
| 2009/0174291 A1* | 7/2009 | Nagano | H03H 9/1021 310/344 |
| 2011/0180317 A1 | 7/2011 | Takahashi et al. | |
| 2014/0016242 A1* | 1/2014 | Hattori | H01G 2/06 361/303 |
| 2014/0124256 A1* | 5/2014 | Hattori | H01G 2/065 174/260 |
| 2014/0268487 A1* | 9/2014 | Yoshida | H01G 2/065 361/301.4 |

* cited by examiner

CHIP ELECTRONIC COMPONENT AND BOARD HAVING THE SAME

CROSS-REFERENCE TO RELATED APPLICATION

This application claims the priority and benefit of Korean Patent Application No. 10-2014-0139021 filed on Oct. 15, 2014, with the Korean Intellectual Property Office, the disclosure of which is incorporated herein by reference.

BACKGROUND

The present disclosure relates to a chip electronic component and a board having the same.

A multilayer ceramic capacitor, a chip electronic component, includes internal electrodes formed between a plurality of dielectric layers.

Such a multilayer ceramic capacitor commonly includes external electrodes formed on both end portions thereof in a length direction, wherein the external electrodes are soldered and physically fixed to component mounting lands of a printed circuit board.

In the case in which a direct current (DC) voltage and an alternating current (AC) voltage are applied to the multilayer ceramic capacitor in which the internal electrodes are overlapped with each other with at least one of the dielectric layers interposed therebetween, a piezoelectric phenomenon between the internal electrodes may occur, and a ceramic body of the multilayer ceramic capacitor may be deformed.

The deformation generated in the ceramic body may be transferred to the printed circuit board, causing noise due to vibration of the printed circuit board.

When such noise, generated by the vibration of the printed circuit board, is included in an audio frequency region (20 to 20,000 Hz), the noise may cause listener discomfort.

Noise generated by the vibration of the printed circuit board is commonly known as acoustic noise.

In this regard, a method of decreasing such acoustic noise is required.

RELATED ART DOCUMENT (Patent Document 1) Japanese Patent Laid-Open Publication No. 2004-134430

SUMMARY

An aspect of the present disclosure may provide a chip electronic component including an interposer having significantly decreased acoustic noise, and a board having the same.

According to an aspect of the present disclosure, a chip electronic component may include: a ceramic body; external electrodes provided on both side portions of the ceramic body; and an interposer supporting the ceramic body and electrically connected to the external electrodes, wherein the interposer includes first and second terminal electrodes provided on both side portions thereof and recesses provided inwardly in the first and second terminal electrodes.

According to another aspect of the present disclosure, a board having a chip electronic component may include: a chip electronic component including a ceramic body, external electrodes provided on both side portions of the ceramic body, and an interposer supporting the ceramic body, electrically connected to the external electrodes, and including first and second terminal electrodes provided on both side portions thereof and recesses provided inwardly in the first and second terminal electrodes; and a printed circuit board including land patterns provided thereon, the land patterns being electrically connected to the first and second terminal electrodes to conduct electricity to the chip electronic component.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
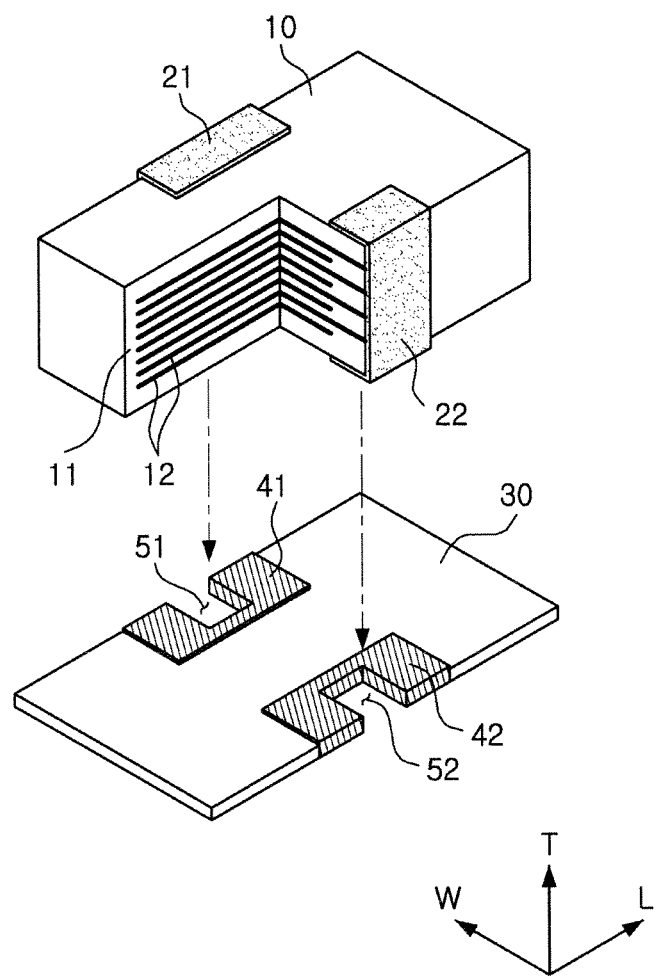
FIG. 1 is a schematic cut-away perspective view of a chip electronic component according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

A chip electronic component according to an exemplary embodiment of the present disclosure may be appropriately used in a multilayer ceramic capacitor, a multilayer varistor, a thermistor, a piezoelectric element, a multilayer substrate, or the like, having a structure in which dielectric layers are used and internal electrodes face each other with each of the dielectric layers interposed therebetween.

Chip Electronic Component

Hereinafter, a chip capacitor will be described as a chip electronic component in the present exemplary embodiment.

FIG. 1 is a schematic cut-away perspective view of a chip electronic component according to an exemplary embodiment of the present disclosure.

Referring to FIG. 1, a chip electronic component may include a chip capacitor including a ceramic body 10 and external electrodes 21 and 22 and an interposer including an interposer substrate 30, terminal electrodes 41 and 42, and recesses 51 and 52.

The ceramic body 10 may be manufactured by applying conductive pastes to ceramic green sheets so as to form internal electrodes 12 on the ceramic green sheet and stacking and then sintering the ceramic green sheets on which the internal electrodes 12 are formed.

The ceramic body 10 may be formed by repeatedly stacking a plurality of dielectric layers 11 and the internal electrodes 12.

The ceramic body 10 may have a hexahedral shape.

Although the ceramic body 10 does not have a hexahedral shape having a perfectly straight line due to firing shrinkage of a ceramic powder at the time of firing a chip, it may have substantially the hexahedral shape.

A direction of the hexahedron will be defined in order to clearly describe exemplary embodiments of the present disclosure. L, W and T shown in FIG. 1 refer to a length direction, a width direction, and a thickness direction, respectively.

Here, the thickness direction may be the same as a direction in which the dielectric layers are stacked.

The multilayer chip capacitor having a rectangular parallelepiped shape in which it has a length larger than a width or a thickness is shown in FIG. 1.

The external electrodes 21 and 22 may be formed of a conductive paste containing a metal powder. The metal powder contained in he conductive paste may be Cu, Ni, or an alloy thereof, but is not particularly limited thereto.

The external electrodes 21 and 22 may be formed on both side portions of the ceramic body 10, respectively, and be extended from both sides of the ceramic body 10 to portions of upper and lower surfaces of the ceramic body 10, respectively, so as to cover both side portions of the ceramic body 10, respectively.

Meanwhile, as a material forming the dielectric layer 11, a high-k ceramic powder may be used in order to increase a capacitance.

The ceramic powder may be, for example, a barium titanate ($BaTiO_3$) based powder or a strontium titanate ($SrTiO_3$) based powder, or the like, but is not limited thereto.

The dielectric layers 11 may be formed by stacking, compressing, and then sintering a plurality of ceramic green sheets.

Here, the dielectric layers 11 may be formed between the internal electrodes 12, and adjacent dielectric layers 11 may be integrated with each other so that boundaries therebetween are not readily apparent without a scanning electron microscope (SEM).

The interposer is formed using the interposer substrate 30 having a plate shape with a thin thickness, and may have a width and a length that are substantially the same as or are slightly larger than those of the ceramic body.

The interposer may include a first terminal electrode 41 and a second terminal electrode 42.

The first and second terminal electrodes 41 and 42 may be disposed to cover both side portions of the interposer substrate 30, respectively.

The first and second terminal electrodes 41 and 42 may be formed on upper and lower surfaces of the interposer substrate 30, and the first and second terminal electrodes 41 and 42 formed on the upper and lower surfaces of the interposer substrate 30 may be electrically connected to each other.

In addition, the recesses 51 and 52 may be formed in the first and second terminal electrodes 41 and 42, respectively.

The recesses 51 and 52 may be formed by removing the interposer substrate 30 and the terminal electrodes 41 and 42 inwardly of side surfaces of the interposer substrate 30 in the width direction.

Figure 2:
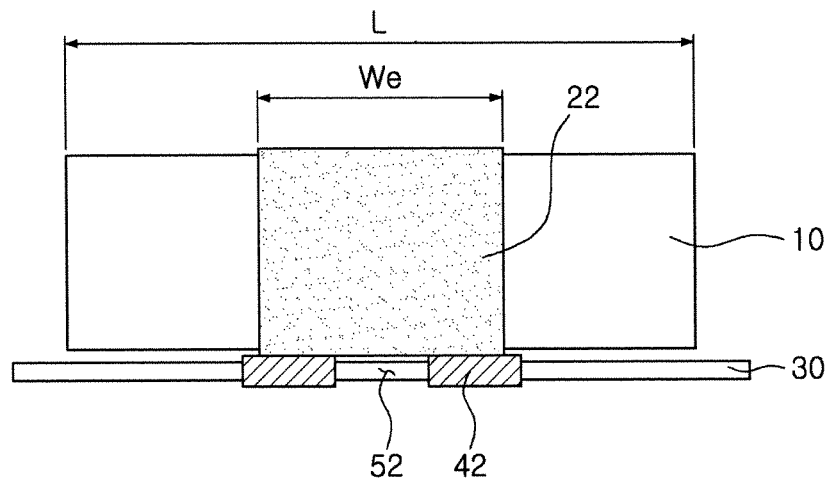
FIG. 2 is a schematic side view of the chip electronic component according to an exemplary embodiment of the present disclosure.

FIG. 2 is a schematic side view of the chip electronic component according to an exemplary embodiment of the present disclosure.

Generally, external electrodes of a chip capacitor may be formed on both end portions of a ceramic body, respectively.

In this case, when voltages are applied to the chip capacitor in a state in which the chip capacitor is mounted on a printed circuit board, acoustic noise may be generated in the printed circuit board.

That is, when voltages having different polarities are applied to the external electrodes formed on both end portions of the chip capacitor, the ceramic body may be expanded and contracted in the thickness direction by an inverse piezoelectric effect of the dielectric layers, and both end portions of the external electrodes in the length direction may be contracted and expanded as opposed to the expansion and contraction of the ceramic body in the thickness direction, by a Poisson effect.

In the case in which the voltages are applied to the chip capacitor, the largest displacement may be generated in both end portions of the ceramic body in the length direction.

However, as shown in FIGS. 1 and 2, in the chip capacitor according to the present exemplary embodiment, the external electrodes 21 and 22 may be formed on both side portions of the ceramic body 10.

Since the external electrodes are not formed on both end portions of the ceramic body in which a displacement amount is largest in the chip capacitor, but are formed on both side portions of the ceramic body in which a displacement amount is small, the acoustic noise may be decreased.

Referring to FIG. 2, when it is assumed that a width of each of the external electrodes 21 and 22 is We and a length of the ceramic body 10 is L, We/L may be 0.20 to 0.89.

The following Table 1 shows measurement values of a sticking strength defective rate and a pick-up defect depending on a We/L value.

TABLE 1

| Sample | We/L | Adhesion Strength Defective Rate (%) | Pick-up Defect | Acoustic noise (dB) |
|---|---|---|---|---|
| 1* | 0.09 | 56 | X | 17.20 |
| 2* | 0.12 | 23 | Δ | 18.23 |
| 3* | 0.14 | 25 | Δ | 18.24 |
| 4* | 0.17 | 4 | ○ | 18.10 |
| 5 | 0.20 | 0 | ◎ | 18.34 |
| 6 | 0.25 | 0 | ◎ | 18.24 |
| 7 | 0.29 | 0 | ◎ | 18.12 |
| 8 | 0.33 | 0 | ◎ | 17.81 |
| 9 | 0.38 | 0 | ◎ | 17.26 |
| 10 | 0.42 | 0 | ◎ | 17.22 |
| 11 | 0.46 | 0 | ◎ | 16.90 |
| 12 | 0.50 | 0 | ◎ | 16.71 |
| 13 | 0.54 | 0 | ◎ | 16.73 |
| 14 | 0.58 | 0 | ◎ | 16.82 |
| 15 | 0.63 | 0 | ◎ | 16.99 |
| 16 | 0.67 | 0 | ◎ | 17.24 |
| 17 | 0.71 | 0 | ◎ | 17.69 |
| 18 | 0.75 | 0 | ◎ | 18.10 |
| 19 | 0.79 | 0 | ◎ | 18.20 |
| 20 | 0.83 | 0 | ◎ | 18.65 |
| 21 | 0.89 | 0 | ◎ | 18.80 |

TABLE 1-continued

| Sample | We/L | Adhesion Strength Defective Rate (%) | Pick-up Defect | Acoustic noise (dB) |
|---|---|---|---|---|
| 22* | 0.92 | 0 | ⊚ | 22.11 |
| 23* | 0.96 | 0 | ⊚ | 22.35 |
| 24* | 1.00 | 0 | ⊚ | 22.70 |

*Comparative Example

A pick-up defect was represented by × in the case in which a defective rate exceeds 50%, was represented by Δ in the case in which a defective rate is 1 to 50, was represented by ○ in the case in which a defective rate 0.01 to 1%, and was represented by ⊚ in the case in which a defective rate is less than 0.01%.

It may be appreciated that when We/L is less than 0.02, adhesion strength becomes weak and a pick-up defective rate is significantly increased.

In addition, in the case in which We/L exceeds 0.89, adhesion strength may become strong and a pick-up defective rate may be decreased, while the external electrodes may become close to both end portions of the ceramic body, having the largest displacement when the voltages are applied to the chip capacitor, such that the acoustic noise may become large.

Therefore, W2/L may be 0.20 to 0.89 in order to increase the adhesion strength, decrease the pick-up defective rate, and decrease the acoustic noise.

Figure 3:
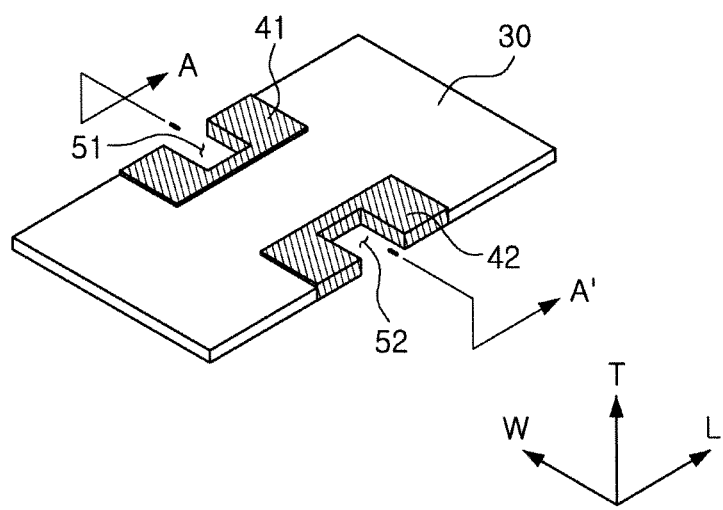
FIG. 3 is a perspective view of an interposer according to a first exemplary embodiment.

FIG. 3 is a perspective view of an interposer according to a first exemplary embodiment.

Figure 4:
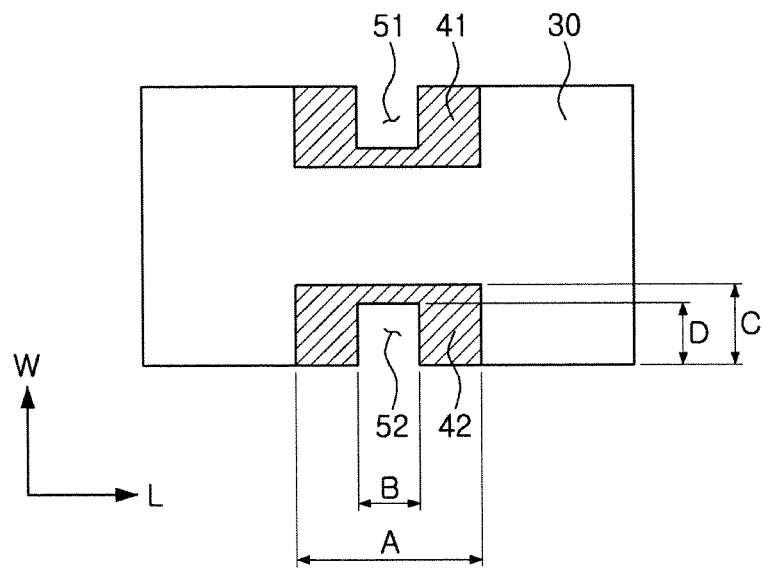
FIG. 4 is a plan view of the interposer according to the first exemplary embodiment.
Figure 5:
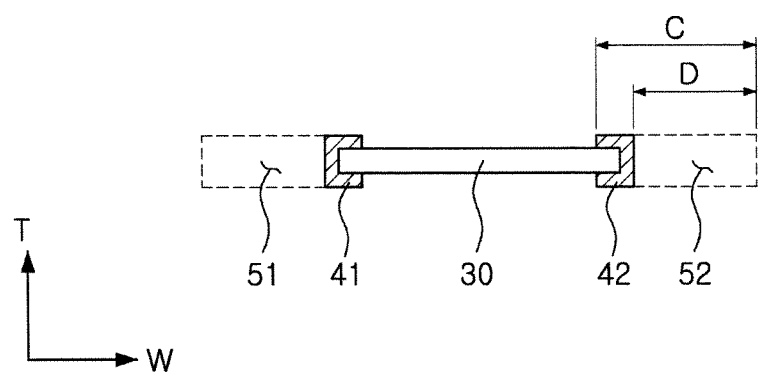
FIG. 5 is a cross-sectional view taken along line A-A' of FIG. 3.

In addition, FIG. 4 is a plan view of the interposer according to the first exemplary embodiment; and FIG. 5 is a cross-sectional view taken along line A-A' of FIG. 3.

Referring to FIGS. 3 to 5, in an interposer according to the first exemplary embodiment, first and second terminal electrodes 41 and 42 may be formed on an interposer substrate 30 so as to cover both side surfaces of the interposer substrate 30 in the length direction.

The interposer substrate 30 may have recesses 51 and 52 formed inwardly in the first and second terminal electrodes 41 and 42, respectively.

Portions of the first and second terminal electrodes 41 and 42 positioned on an upper surface of the interposer substrate 30 may be electrically connected to the external electrodes 21 and 22.

In addition, portions of the first and second terminal electrodes 41 and 42 positioned on the upper surface of the interposer substrate 30 may be soldered and electrically connected to land patterns 161 and 162 of a printed circuit board 100 (See FIG. 9) to be described below.

Portions of the first and second terminal electrodes 41 and 42 formed on the upper and lower surfaces of the interposer substrate 30 may be electrically connected to each other.

Therefore, the external electrodes 21 and 22 may be electrically connected to the land patterns 161 and 162 of the printed circuit board 100 through the terminal electrodes 41 and 42 of the interposer substrate 30, respectively.

Referring to FIG. 4, a length of each of the terminal electrodes 41 and 42 may be defined as A, a length of each of the recesses 51 and 52 may be defined as B, a width of each of the terminal electrodes 41 and 42 may be defined as C, and a width of each of the recesses 51 and 52 may be defined as D.

The following Table 2 shows execution results of acoustic noise (dB) and drop tests of a chip electronic component manufactured according to an exemplary embodiment of the present disclosure.

TABLE 2

| Sample | A (μm) | B (μm) | C (μm) | D (μm) | A × C (μm2) | B × D (μm2) | (B × D)/(A × C) | Acoustic noise (dB) | Drop Test Result |
|---|---|---|---|---|---|---|---|---|---|
| 1* | 812.0 | 211.0 | 120.0 | 35.0 | 97440 | 7385 | 0.076 | 16.50 | x |
| 2* | 587.0 | 174.0 | 116.0 | 41.0 | 68092 | 7134 | 0.105 | 16.70 | x |
| 3* | 571.0 | 415.0 | 195.0 | 32.0 | 111345 | 13280 | 0.119 | 16.73 | x |
| 4 | 479.0 | 314.0 | 165.0 | 42.0 | 79035 | 13188 | 0.167 | 16.91 | ○ |
| 5 | 680.0 | 514.0 | 158.0 | 43.0 | 107440 | 22102 | 0.206 | 16.99 | ○ |
| 6 | 120.0 | 45.0 | 85.0 | 51.0 | 10200 | 2295 | 0.225 | 17.21 | ○ |
| 7 | 672.0 | 415.0 | 157.0 | 58.0 | 105504 | 24070 | 0.228 | 17.22 | ○ |
| 8 | 198.0 | 90.0 | 253.0 | 150.0 | 50094 | 13500 | 0.269 | 17.24 | ○ |
| 9 | 100.0 | 45.0 | 85.0 | 51.0 | 8500 | 2295 | 0.270 | 17.90 | ○ |
| 10 | 280.0 | 128.0 | 321.0 | 250.0 | 89880 | 32000 | 0.356 | 18.00 | ○ |
| 11 | 108.0 | 91.0 | 245.0 | 123.0 | 26460 | 11193 | 0.423 | 18.11 | ○ |
| 12 | 480.0 | 381.0 | 241.0 | 150.0 | 115680 | 57150 | 0.494 | 18.21 | ○ |
| 13 | 392.0 | 252.0 | 121.0 | 100.0 | 47432 | 25200 | 0.531 | 18.30 | ○ |
| 14 | 421.0 | 312.0 | 111.0 | 98.0 | 46731 | 30576 | 0.654 | 18.40 | ○ |
| 15 | 980.0 | 850.0 | 121.0 | 99.0 | 118580 | 84150 | 0.710 | 18.60 | ○ |
| 16* | 840.0 | 751.0 | 161.0 | 150.0 | 135240 | 112650 | 0.833 | 22.00 | ○ |
| 17* | 898.0 | 850.0 | 119.0 | 110.0 | 106862 | 93500 | 0.875 | 22.50 | ○ |

*Comparative Example

The drop test was performed by a free fall method at a height of 1 m, and the case in which the chip capacitor are electrically disconnected from the terminal electrodes was represented by × and the case in which the chip capacitor are electrically connected to the terminal electrode was represented by ○.

It may be appreciated from the above Table 2 that in the case in which (B×D)/(A×C) exceeds 0.710, acoustic noise is 22.00 dB or more, such that vary large noise is generated.

However, in which (B×D)/(A×C) is less than 0.167, adhesion between the interposer and the chip capacitor may be decreased, such that the interposer and the chip capacitor may not endure drop impact.

Therefore, the recesses 51 and 52 may be formed so as to satisfy 0.167≤(B×D)/(A×C)≤0.710 in order to decrease acoustic noise and increase adhesion.

Figure 6:
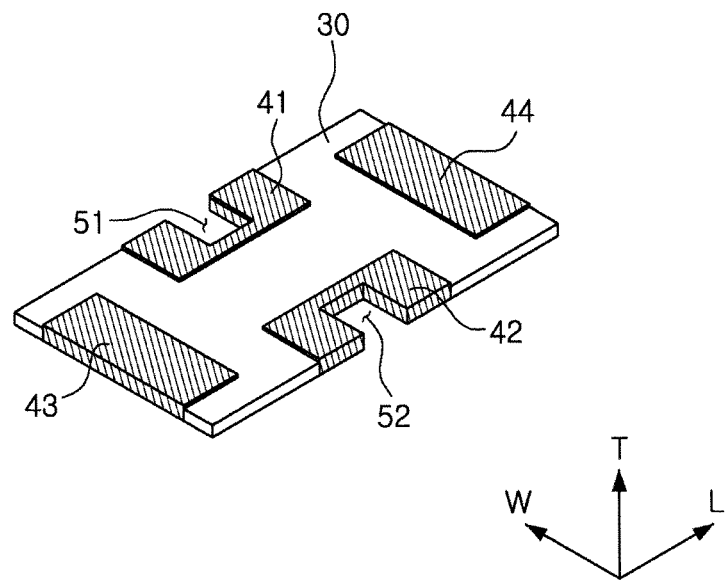
FIG. 6 is a perspective view of an interposer according to a second exemplary embodiment.
Figure 7:
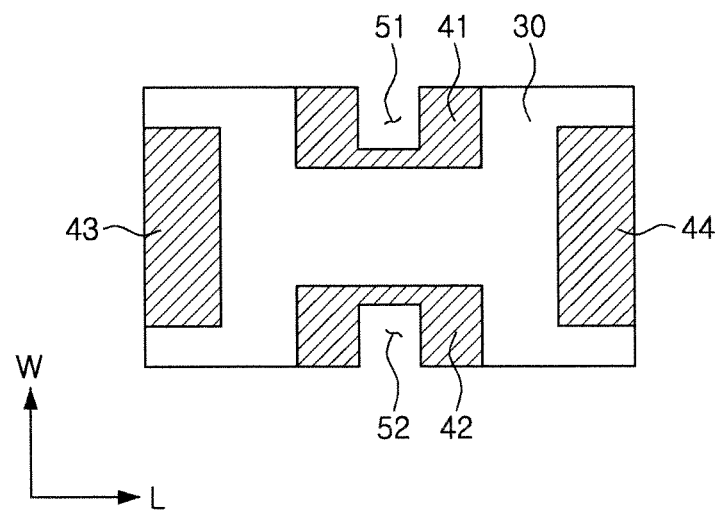
FIG. 7 is a plan view of the interposer according to the second exemplary embodiment.
Figure 8:
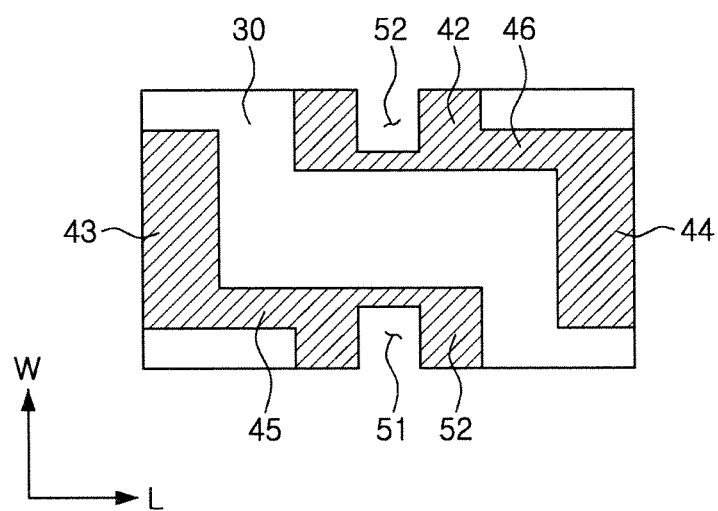
FIG. 8 is a bottom view of the interposer according to the second exemplary embodiment.

FIG. 6 is a perspective view of an interposer according to a second exemplary embodiment; and FIGS. 7 and 8 are, respectively, a plan view and a bottom view of the interposer according to the second exemplary embodiment.

Referring to FIGS. 6 to 8, an interposer according to the second exemplary embodiment may further include third and fourth terminal electrodes 43 and 44.

The third and fourth terminal electrodes 43 and 44 may cover both end portions of the interposer substrate 30.

The third and fourth terminal electrodes 43 and 44 may be electrically connected to the first and second terminal electrodes 41 and 42, respectively.

For example, as shown in FIG. 8, the third and fourth terminal electrodes may be connected to the first and second terminal electrodes 41 and 42, respectively, by connecting electrodes 45 and 46 formed on the lower surface of the interposer substrate 30.

Board Having Chip Electronic Component

Figure 9:
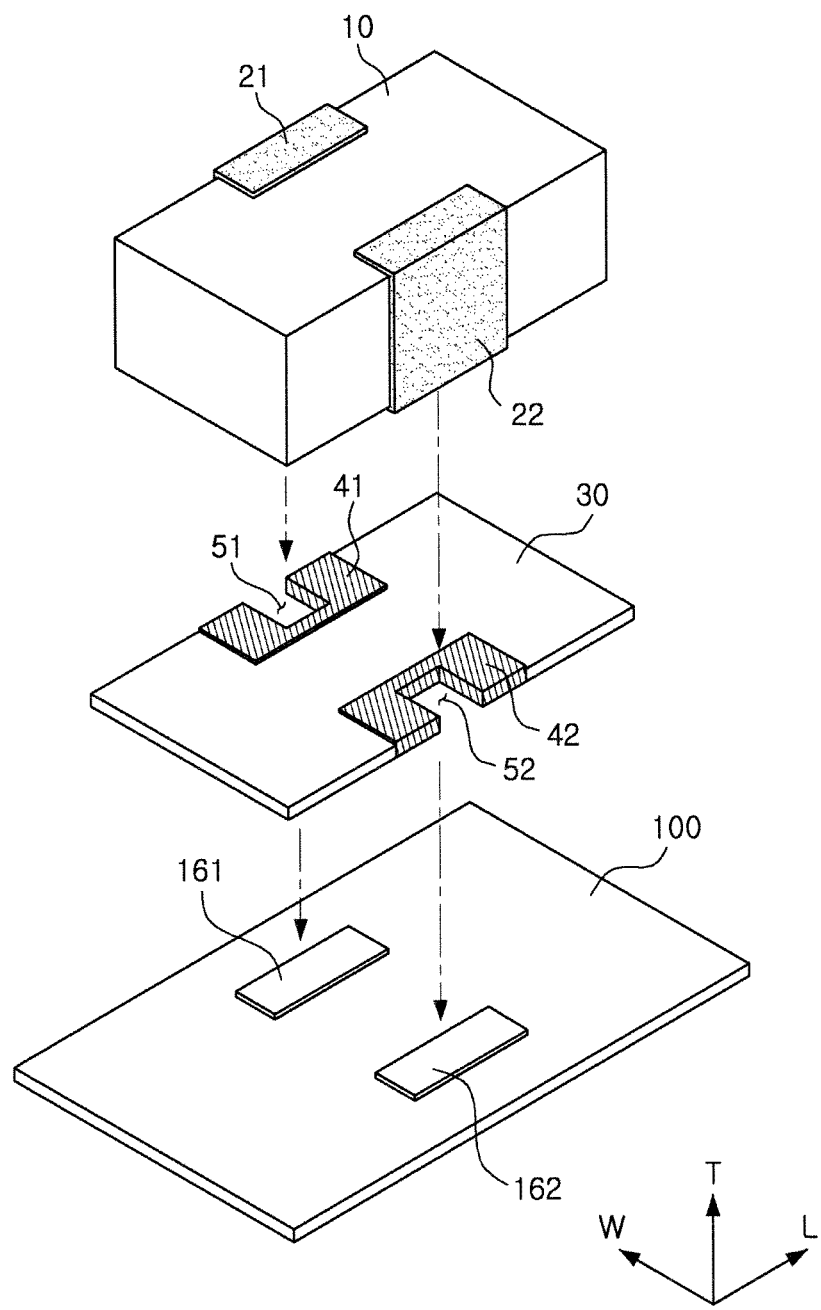
FIG. 9 is a schematic exploded perspective view of a chip electronic component and a printed circuit board according to an exemplary embodiment of the present disclosure.

FIG. 9 is a schematic exploded perspective view of a chip electronic component and a printed circuit board according to an exemplary embodiment of the present disclosure.

Referring to FIG. 9, a board having a chip electronic component according to an exemplary embodiment of the present disclosure may include the chip electronic component including the interposer described above and a printed circuit board 100.

Here, the chip electronic component may be a chip capacitor including the ceramic body 10 in which the internal electrodes 12 and the dielectric layers 11 are alternately stacked, wherein the internal electrodes 12 are disposed to have each of the dielectric layers 11 interposed therebetween and are led to the external electrodes 41 and 44 formed on side portions of the ceramic body 10 and having different polarities.

The internal electrodes 12 may be formed to be perpendicular with respect to the terminal electrodes 41 and 42.

The printed circuit board 100 may include the land patterns 161 and 162 electrically connected to the first and second terminal electrodes 41 and 42 of the interposer to conduct to the chip electronic component.

The land patterns 161 may be disposed at both sides of the printed circuit board 100 in the length direction so as to correspond to positions at which the first and second terminal electrodes 41 and 42 are formed.

The first and second terminal electrodes 41 and 42 may be attached to the land patterns 161 and 162, respectively, by solders. In this case, a larger amount of solders may be injected due to the recesses 51 and 52 to increase sticking strength.

Figure 10:
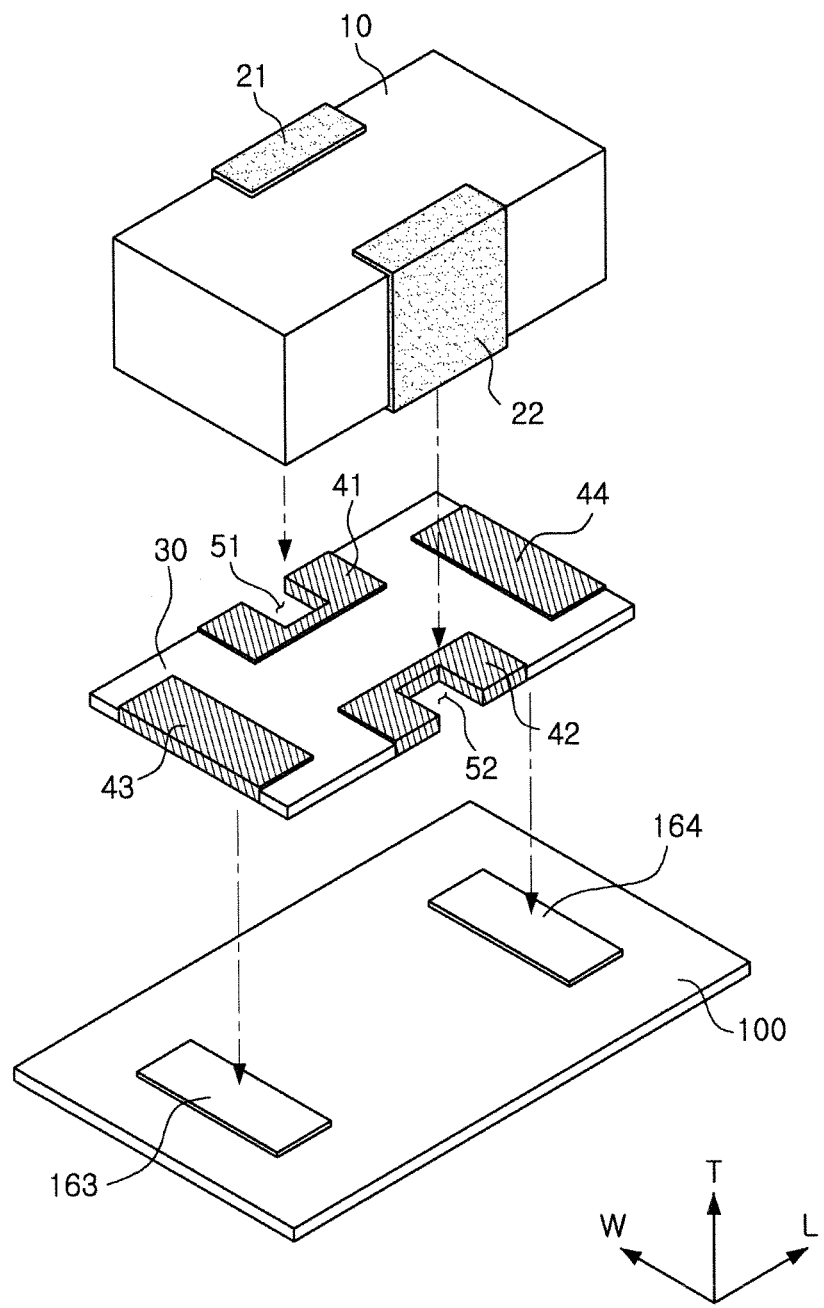
FIG. 10 is a schematic exploded perspective view of a chip electronic component and a printed circuit board according to another exemplary embodiment of the present disclosure.

FIG. 10 is a schematic exploded perspective view of a chip electronic component and a printed circuit board according to another exemplary embodiment of the present disclosure.

Referring to FIG. 10, the interposer may further include the third and fourth terminal electrodes 43 and 44 formed on both end portions of the interposer substrate 30. The third and fourth terminal electrodes 43 and 44 may be electrically connected to the first and second terminal electrodes 41 and 42, respectively.

As described above, in the case in which the external electrodes 21 and 22 are formed on both side portions of the ceramic body 10, the acoustic noise may be decreased. However, in a general case, a printed circuit board having other land patterns needs to be used in order to mount the chip electronic component having the external electrodes 21 and 22 on both side portions thereof.

However, in the case of using the interposer according to the second exemplary embodiment described above, the external electrodes 21 and 22 of the chip capacitor may be electrically connected to land patterns 163 and 164 even in the case in which the land patterns 163 and 164 are disposed on both end portions of the printed circuit board 100 in the length direction.

Therefore, in the case of using the interposer according to the second exemplary embodiment of the present disclosure, the chip electronic component may be mounted on a general printed circuit board without using a separate device.

As set forth above, with the chip electronic component and the board having the same according to exemplary embodiments of the present disclosure, the acoustic noise may be significantly decreased.

While exemplary embodiments have been shown and described above, it will be apparent to those skilled in the art that modifications and variations could be made without departing from the scope of the present invention as defined by the appended claims.

What is claimed is:

1. A chip electronic component comprising:
   a ceramic body;
   external electrodes provided on both side portions of the ceramic body in a length direction; and
   an interposer supporting the ceramic body and electrically connected to the external electrodes,
   wherein the interposer includes:
   first and second terminal electrodes provided on both side portions thereof in the length direction; and
   recesses provided inwardly in the first and second terminal electrodes along the side portions of the interposer in the length direction.

2. The chip electronic component of claim 1, wherein when a width of each of the external electrodes is We and a length of the ceramic body is L, We/L is 0.20 to 0.89.

3. The chip electronic component of claim 1, wherein when a length of each of the first and second terminal electrodes is A, a length of each of the recesses is B, a width of each of the first and second terminal electrodes is C, and a width of each of the recesses is D, $0.167 \leq (B \times D)/(A \times C) \leq 0.710$ is satisfied.

4. The chip electronic component of claim 1, wherein the interposer further includes third and fourth terminal electrodes provided on both end portions thereof.

5. The chip electronic component of claim 1, wherein the ceramic body includes internal electrodes and dielectric layers that are alternately stacked,
   the internal electrodes disposed to be parallel to the first and second terminal electrodes.

6. The chip electronic component of claim 4, wherein the third and fourth terminal electrodes are connected to the first and second terminal electrodes respectively.

* * * * *